(12) United States Patent  
Greene et al.

(10) Patent No.: US 8,106,455 B2  
(45) Date of Patent: Jan. 31, 2012

(54) THRESHOLD VOLTAGE ADJUSTMENT THROUGH GATE DIELECTRIC STACK MODIFICATION

(75) Inventors: Brian J. Greene, Wappingers Falls, NY (US); Michael P. Chudzik, Danbury, CT (US); Shu-Jen Han, Wappingers Falls, NY (US); William K. Henson, Beacon, NY (US); Yue Liang, Beacon, NY (US); Edward P. Maciejewski, Wappingers Falls, NY (US); Myung-Hee Na, Lagrangeville, NY (US); Edward J. Nowak, Essex Junction, VT (US); Xiaojun Yu, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 12/432,927

(22) Filed: Apr. 30, 2009

(65) Prior Publication Data

US 2010/0276753 A1 Nov. 4, 2010

(51) Int. Cl.  
*H01L 27/01* (2006.01)  
*H01L 27/12* (2006.01)  
*H01L 31/0392* (2006.01)

(52) U.S. Cl. ........ 257/347; 257/392; 257/410; 438/587; 438/591

(58) Field of Classification Search .................. 257/347, 257/392, 410, E27.062, E27.112; 438/587, 438/591  
See application file for complete search history.

(56) References Cited

U.S. PATENT DOCUMENTS

| 6,281,559 | B1 | 8/2001 | Yu et al. | |
| 6,373,111 | B1 | 4/2002 | Zheng et al. | |
| 6,552,377 | B1 | 4/2003 | Yu | |
| 6,693,333 | B1 | 2/2004 | Yu | |
| 7,081,656 | B2 * | 7/2006 | Eppich et al. | 257/392 |
| 7,863,126 | B2 * | 1/2011 | Park et al. | 438/216 |
| 7,943,457 | B2 * | 5/2011 | Chudzik et al. | 438/199 |
| 2005/0334897 | | 10/2005 | Chen et al. | |
| 2007/0173008 | A1 | 7/2007 | Chudzik et al. | |
| 2009/0152650 | A1 * | 6/2009 | Chudzik et al. | 257/410 |

OTHER PUBLICATIONS

International Search Report and Written Opinion, Jul. 2, 2010.

* cited by examiner

*Primary Examiner* — Phuc Dang  
(74) *Attorney, Agent, or Firm* — Scully, Scott, Murphy & Presser, P.C.; H. Daniel Schurmann

(57) ABSTRACT

Multiple types of gate stacks are formed on a doped semiconductor well. A high dielectric constant (high-k) gate dielectric is formed on the doped semiconductor well. A metal gate layer is formed in one device area, while the high-k gate dielectric is exposed in other device areas. Threshold voltage adjustment oxide layers having different thicknesses are formed in the other device areas. A conductive gate material layer is then formed over the threshold voltage adjustment oxide layers. One type of field effect transistors includes a gate dielectric including a high-k gate dielectric portion. Other types of field effect transistors include a gate dielectric including a high-k gate dielectric portion and a first threshold voltage adjustment oxide portions having different thicknesses. Field effect transistors having different threshold voltages are provided by employing different gate dielectric stacks and doped semiconductor wells having the same dopant concentration.

19 Claims, 12 Drawing Sheets

THRESHOLD VOLTAGE ADJUSTMENT THROUGH GATE DIELECTRIC STACK MODIFICATION

FIELD OF THE INVENTION

The present invention generally relates to semiconductor devices, and particularly to field effect transistors having different threshold voltages through gate dielectric stack modification, and methods of manufacturing the same.

BACKGROUND OF THE INVENTION

Advanced semiconductor chips employ multiple types of field effect transistors having different threshold voltages, on-current per unit width, and off-current per unit length. Field effect transistors having a high threshold voltage are typically called "low power" devices, which have a low on-current and a low off-current. Field effect transistors having a low threshold voltage are called "high performance" devices, which has a high on-current and a high off-current. By employing a mixture of low power devices and high performance devices, a semiconductor chip may provide optimal performance at an optimal power consumption level.

Devices having different threshold voltages may be obtained by varying dopant concentration of a doped semiconductor well in which the body of a field effect transistor is formed for each value of the threshold voltages. Thus, a high performance device employs a doped semiconductor well having a low dopant concentration, while a low power device employs another doped semiconductor well having a high dopant concentration. For each setting of well doping, a dedicated implantation mask is employed during a corresponding ion implantation step for formation of a doped semiconductor well, thereby increasing processing complexity and cost of manufacturing.

In addition to the increased processing cost, low power devices employing a doped semiconductor well having a high dopant concentration also suffer from increased junction leakage. Typically, low power devices display a value for reverse junction leakage current to forward junction leakage current ratio that is many orders of magnitude higher than a corresponding value for high performance devices. As the total leakage current is dominated by a junction leakage current, the method of providing a low power device by increasing the dopant concentration of a doped semiconductor well becomes more and more difficult. Furthermore, in the case where such FETs are SOI FETs and have so-called floating bodies, the increased junction leakage of the low power devices tends to increase the forward-bias voltage of the floating body, thereby lowering Vt and opposing the desired effect of lower leakage currents.

In summary, a high dopant concentration in a doped semiconductor well containing the body of a transistor induces a high junction leakage current. Due to the increase in the junction leakage current, the method of modulating the well doping to form a low leakage field effect transistor becomes less effective in suppressing the total leakage current despite a high threshold voltage.

SUMMARY OF THE INVENTION

Multiple field effect transistors having different gate dielectric stacks are employed in the present invention to provide different threshold voltages.

In the present invention, multiple types of gate stacks are formed on a doped semiconductor well. A high dielectric constant (high-k) gate dielectric is formed on the doped semiconductor well. A metal gate layer is formed in one device area, while the high-k gate dielectric is exposed in other device areas. Threshold voltage adjustment oxide layers having different thicknesses are formed in the other device areas. A conductive gate material layer is formed over the threshold voltage adjustment oxide layers. One type of field effect transistors includes a gate dielectric including a high-k gate dielectric portion. Other types of field effect transistors include a gate dielectric including a high-k gate dielectric portion and a first threshold voltage adjustment oxide portions having different thicknesses. Field effect transistors having different threshold voltages are provided by employing different gate dielectric stacks and doped semiconductor wells having the same dopant concentration.

According to an aspect of the present invention, a semiconductor structure is provided, which includes: a first field effect transistor including a first gate stack, wherein the first gate stack includes, from bottom to top, a first high dielectric constant (high-k) gate dielectric having a dielectric constant greater than 4.0, a metal gate portion, at least one metal portion, and a first conductive gate material portion; and a second field effect transistor including a second gate stack, wherein the second gate stack includes, from bottom to top, a second high-k gate dielectric having a dielectric constant greater than 4.0, at least one dielectric metal oxide portion, and a second conductive gate material portion, wherein the first field effect transistor and the second field effect transistor have different threshold voltages.

According to another aspect of the present invention, another semiconductor structure is provided, which includes: a first field effect transistor including a first gate stack, wherein the first gate stack includes, from bottom to top, a first high dielectric constant (high-k) gate dielectric, at least one first dielectric metal oxide portion, and a first conductive gate material portion; and a second field effect transistor including a second gate stack, wherein the second gate stack includes, from bottom to top, a second high-k gate dielectric, at least one second dielectric metal oxide portion, and a second conductive gate material portion, wherein the first field effect transistor and the second field effect transistor have different threshold voltages.

According to yet another aspect of the present invention, a method of forming a semiconductor structure is provided, which includes: forming a high dielectric constant (high-k) gate dielectric layer including a dielectric material having a dielectric constant greater than 4.0 on a semiconductor substrate; forming a metal gate layer directly on a first portion of the high-k gate dielectric layer; depositing at least one metal layer directly on the metal gate layer and a second portion of the high-k gate dielectric layer, wherein at least one dielectric metal oxide layer is formed directly on the second portion of the high-k dielectric layer through oxidation of a portion of the at least one metal layer; and forming a conductive gate material layer directly on the at least one metal layer and the at least one dielectric metal oxide portion.

According to still another aspect of the present invention, another method of forming a semiconductor structure is provided, which includes: forming a high dielectric constant (high-k) gate dielectric layer including a dielectric material having a dielectric constant greater than 4.0 on a semiconductor substrate; depositing at least one metal layer directly on the high-k gate dielectric layer, wherein at least one dielectric metal oxide layer is formed directly on the high-k dielectric layer through oxidation of the at least one metal layer; removing a portion of at least one of the at least one dielectric metal oxide layer, wherein at least one first dielectric metal oxide layer and at least one second dielectric metal oxide layer having different thicknesses are formed, and forming a conductive gate material layer directly on the at least one metal layer and the at least one dielectric metal oxide portion.

DETAILED DESCRIPTION OF THE INVENTION

Figure 1:
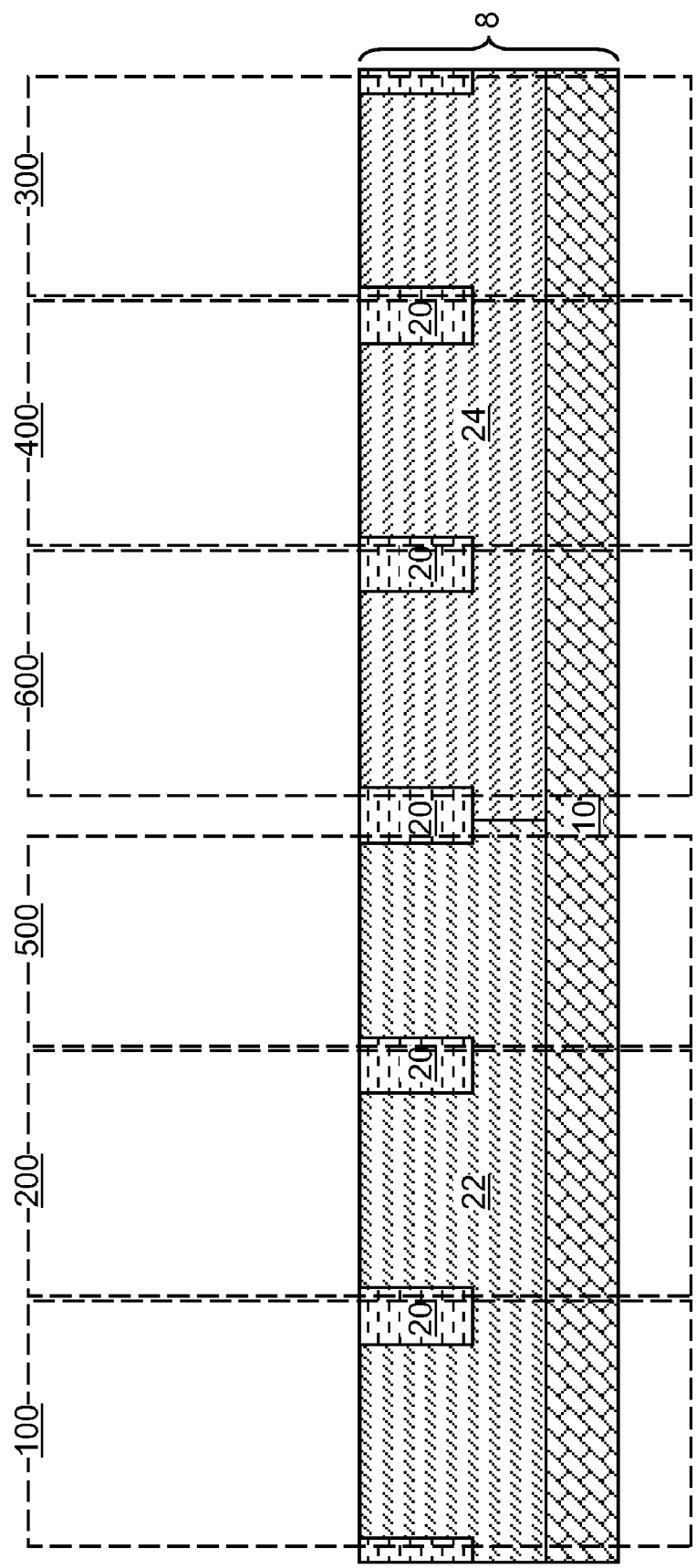
FIG. 1 is a vertical cross-sectional view of a first exemplary semiconductor structure corresponding to a step after formation of an n-doped semiconductor well and a p-doped semiconductor well.

As stated above, the present invention relates to field effect transistors having different threshold voltages through gate dielectric stack modification, and methods of manufacturing the same, which are now described in detail with accompanying figures. Like and corresponding elements are referred to by like reference numerals. Proportions of various elements in the accompanying figures are not drawn to scale.

Referring to FIG. 1, a first exemplary semiconductor structure according to a first embodiment of the present invention includes a semiconductor substrate 8. The semiconductor substrate 8 includes a semiconductor region 10 containing a semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the semiconductor region 10 is single crystalline, i.e., have the same set of crystallographic orientations, or "epitaxial."

The semiconductor substrate 8 further includes shallow trench isolation structures 20, which comprise a dielectric material such as silicon oxide, silicon nitride, silicon oxynitride, or a combination thereof. The semiconductor substrate 8 may be a bulk substrate, a semiconductor-on-insulator (SOI) substrate, or a hybrid substrate having a bulk portion and an SOI portion. While the first embodiment is described with a bulk substrate, embodiments employing an SOI substrate or a hybrid substrate are explicitly contemplated herein.

Dopants of a first conductivity type are introduced into a first upper portion of the semiconductor region 10 by ion implantation or other doping methods to form a first doped semiconductor well 22. For example, the first upper portion of the semiconductor region may be located within a region including a first device region 100, a second device region 200, and a fifth device region 500. The first conductivity type may be n-type or p-type. If the first conductivity type is n-type, the first doped semiconductor well 22 is an n-doped semiconductor well. If the first conductivity type is p-type, the first doped semiconductor well 22 is a p-doped semiconductor well. The first doped semiconductor well 22 has a first conductivity type doping at substantially the same dopant concentration throughout. The dopant concentration of the first doped semiconductor well 22 may have a value from $1.0 \times 10^{16}/cm^3$ atoms/$cm^3$ to $3.0 \times 10^{19}/cm^3$ atoms/$cm^3$, and typically a value from $1.0 \times 10^{17}/cm^3$ atoms/$cm^3$ to $1.0 \times 10^{19}/cm^3$ atoms/$cm^3$.

Dopants of a second conductivity type are introduced into a second upper portion of the semiconductor region 10 by ion implantation or other doping methods to form a second doped semiconductor well 24. For example, the second upper portion of the semiconductor region may be located within a region including a third device region 300, a fourth device region 400, and a sixth device region 600. The second conductivity type is the opposite of the first conductivity type. If the first conductivity type is n-type, the second conductivity type is n-type, and vice versa. If the second conductivity type is p-type, the second doped semiconductor well 24 is a p-doped semiconductor well. If the second conductivity type is n-type, the second doped semiconductor well 24 is an n-doped semiconductor well. The second doped semiconductor well 24 has a second conductivity type doping at substantially the same dopant concentration throughout. The dopant concentration of the second doped semiconductor well 24 may have a value from $1.0 \times 10^{16}/cm^3$ atoms/$cm^3$ to $3.0 \times 10^{19}/cm^3$ atoms/$cm^3$, and typically a value from $1.0 \times 10^{17}/cm^3$ atoms/$cm^3$ to $1.0 \times 10^{19}/cm^3$ atoms/$cm^3$.

Preferably, the entirety of the first doped semiconductor well 22, the second doped semiconductor well 24, and the semiconductor region 10 is single crystalline. The semiconductor region 10 may be substantially undoped, p-doped, or n-doped.

Figure 2:
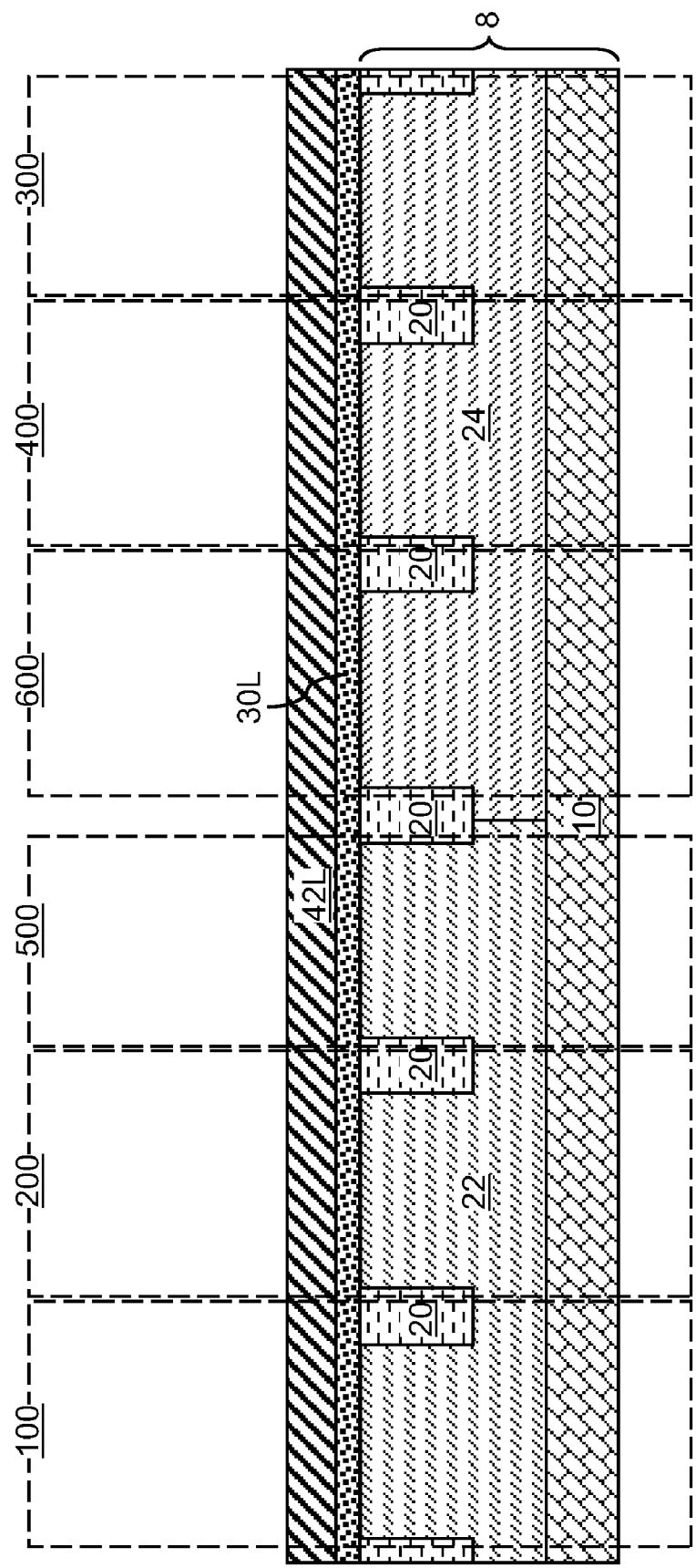
FIG. 2 is a vertical cross-sectional view of the first exemplary semiconductor structure corresponding to a step after formation of a high dielectric constant (high-k) gate dielectric layer and a metal gate layer.

Referring to FIG. 2, a high dielectric constant (high-k) gate dielectric layer 30L is formed on the top surfaces of the first doped semiconductor well 22 and the second doped semiconductor well 24. Optionally, a dielectric interface layer (not shown) may be formed between the first and second doped semiconductor wells (22, 24) and the high-k gate dielectric layer 30L. The dielectric interface layer may include a semiconductor oxide, a semiconductor oxynitride, or a semiconductor nitride. For example, the dielectric interface layer may be a "chemical oxide," which is formed by treatment of a top surface of the first and second doped semiconductor wells (22, 24) with a chemical. The thickness of the dielectric interface layer, if present, may be from 0.1 nm to 0.8 nm, although lesser and greater thicknesses are also contemplated herein. Otherwise, the high-k dielectric material layer 30L may be formed directly on the first and second doped semiconductor wells (22, 24).

The high dielectric constant (high-k) gate dielectric layer 30L is formed on the first and second doped semiconductor wells (22, 24) by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. The high-k gate dielectric layer 30L includes a dielectric metal oxide having a dielectric constant that is greater than the dielectric constant of silicon oxide of 3.9. Typically, the high-k gate dielectric layer 30L has a dielectric constant greater than 4.0. Preferably, the high-k gate dielectric layer 30L has a dielectric constant greater than 8.0. The dielectric metal oxide is a high-k material containing a metal and oxygen, and is known in the art as high-k gate dielectric materials. Exemplary high-k material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k gate dielectric layer 30L may be from 0.9 nm to 6 nm, and preferably from 1.2 nm to 3 nm. The high-k gate dielectric layer 30L may have an effective oxide thickness on the order of or less than 1 nm.

A metal gate layer 42L is formed directly on the high-k gate dielectric layer 30L. The metal gate layer 42L contains a metal or a conductive metallic alloy having a work function between the valence band edge and the conduction band edge of the semiconductor material of the first and second doped semiconductor wells (22, 24). The metal gate layer 42L may contain W, Ta, TiN, ZrN, HfN, VN, NbN, TaN, WN, TiAlN, TaC, TaMgC, TaCN, another conductive refractory metal nitride, or a combination or an alloy thereof. The metal gate layer 42L may be formed by chemical vapor deposition (CVD), physical vapor deposition (PVD), atomic layer deposition (ALD), vacuum evaporation, etc. The metal gate layer 42L may comprise a metal from Group IVB or VB of the Periodic Table of Elements or other transition metals. The thickness of the metal gate layer 42L may be from 5 nm to 100 nm, and typically from 10 nm 50 nm, although lesser and greater thicknesses are also contemplated herein.

Figure 3:
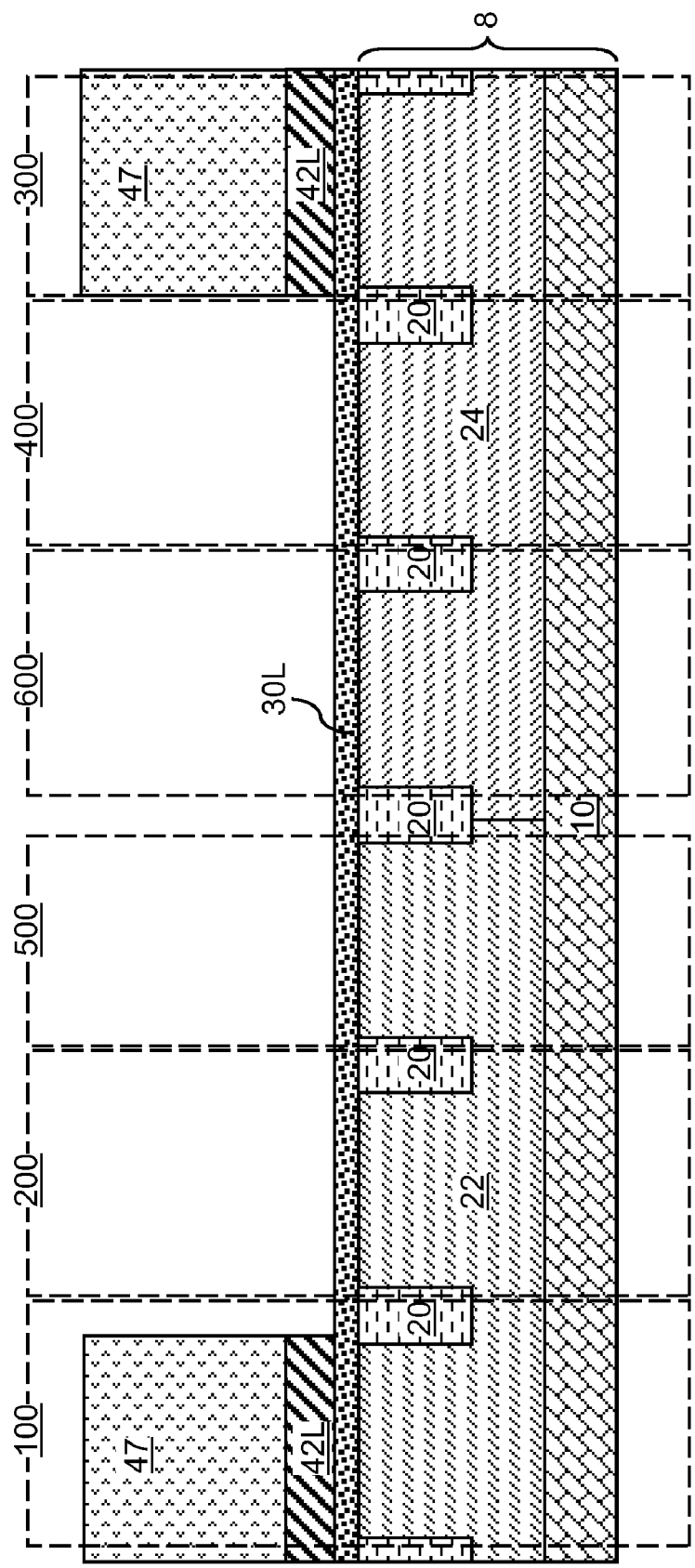
FIG. 3 is a vertical cross-sectional view of the first exemplary semiconductor structure corresponding to a step after patterning of the metal gate layer.

Referring to FIG. 3, a first photoresist 47 is applied over the metal gate layer 42L and is lithographically patterned to cover the metal gate layer 42L in the first device region 100 and the third device region 300. The top surface of the metal gate layer 42L is exposed in the second device region 200, the fourth device region 400, the fifth device region 500, and the sixth device region 600. The exposed portions of the metal gate layer 42L are removed by an etch employing the first photoresist 47 as an etch mask. The etch may be a dry etch or a wet etch. Preferably, the etch is selective to the material of the high-k gate dielectric layer 30L, i.e., does not remove the high-k gate dielectric layer 30L in any substantial manner. Thus, the top surface of the high-k gate dielectric layer 30L is exposed after the etch in the second, fourth, fifth, and sixth device regions (200, 400, 500, 600). The first photoresist 47 is subsequently removed.

Figure 4:
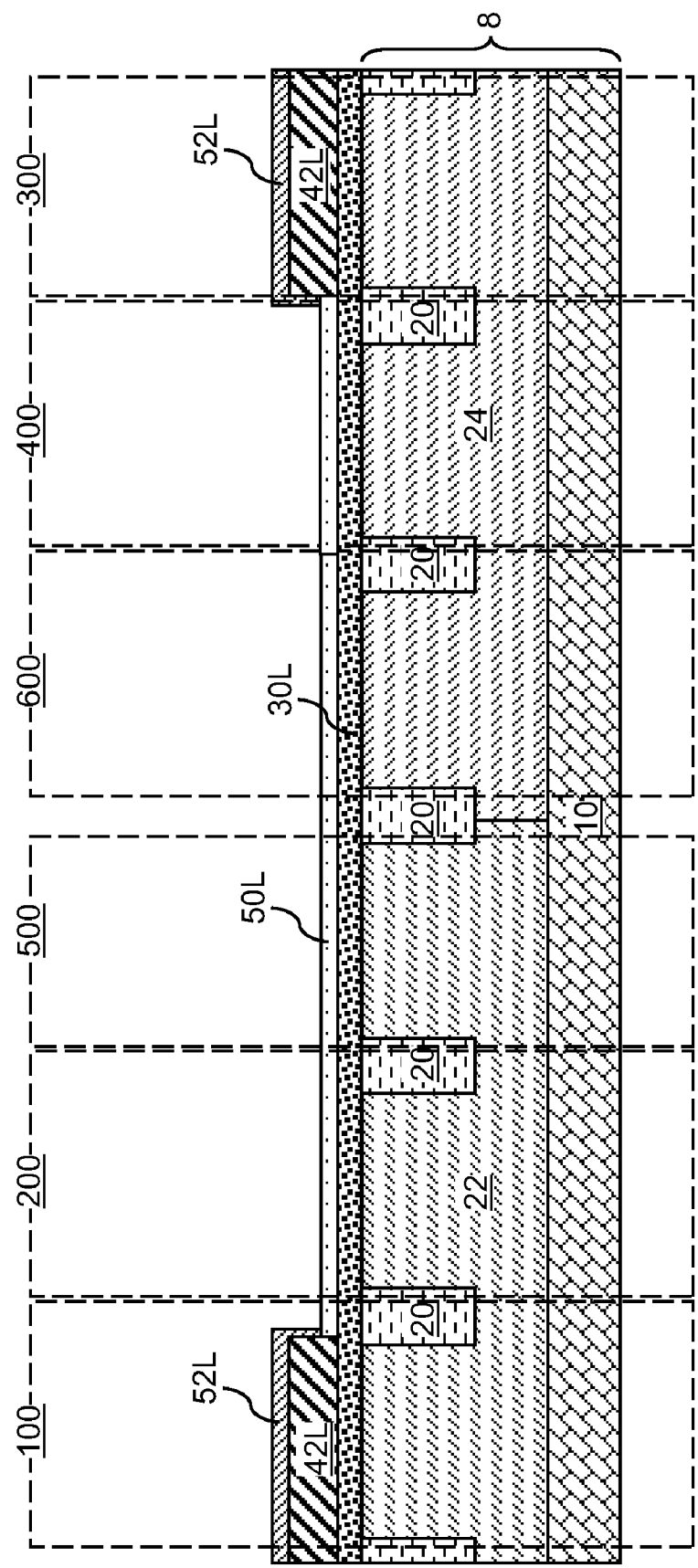
FIG. 4 is a vertical cross-sectional view of the first exemplary semiconductor structure corresponding to a step after deposition of a first metal layer.

Referring to FIG. 4, a first metal layer 52L is deposited on the exposed surfaces of the metal gate layer 42L and the exposed surface of the high-k gate dielectric layer 30L. The first metal layer 52L is a group IIA/IIIB element layer, i.e., includes an element in group IIA or group IIIB in the Periodic Table of Elements. The first metal layer 52L may be formed directly on the high-k gate dielectric layer 30L and the metal gate layer 42L by methods well known in the art including, for example, CVD, PVD, MBD, PLD, LSMCD, ALD, etc. The first metal layer 52L includes one of the group IIA elements and the group IIIB elements. Specifically, the first metal layer 52L may include one of Be, Mg, Ca, Sr, Ba, Ra, Sc, Y, La, Ce, Pr, Nd, Pm, Sm, Eu, Gd, Tb, Dy, Ho, Er, Tm, Yb, and Lu. The thickness of the first metal layer 52L may be from 0.1 nm to 0.8 nm, although lesser and greater thicknesses are also explicitly contemplated.

The group IIA elements and the group IIIB elements have the propensity to react with oxygen to form a dielectric metal oxide. Thus, the portion of the first metal layer 52L deposited directly on the high-k gate dielectric layer 30L acquires oxygen from the underlying high-k gate dielectric layer 30L. By combining with oxygen, the portion of the first metal layer 52L directly above the high-k gate dielectric layer 30L is converted into a first dielectric metal oxide layer 50L. The first dielectric metal oxide layer 50L contains an oxide of the metal of the first metal layer 52L. The first metal layer 52L is not converted over the top surfaces and sidewall surfaces of the metal gate layer 42L because the metal gate layer 42L does not provide any oxygen. The first metal layer 52L containing a group IIA element or a group IIIB element is formed directly on the top surfaces and sidewalls of the metal gate layer 42L in the first device region 100 and the third device region 300. The first dielectric metal oxide layer 50L is formed directly on the high-k gate dielectric layer 30L in the second, fourth, fifth, and sixth device regions (200, 400, 500, 600).

Figure 5:
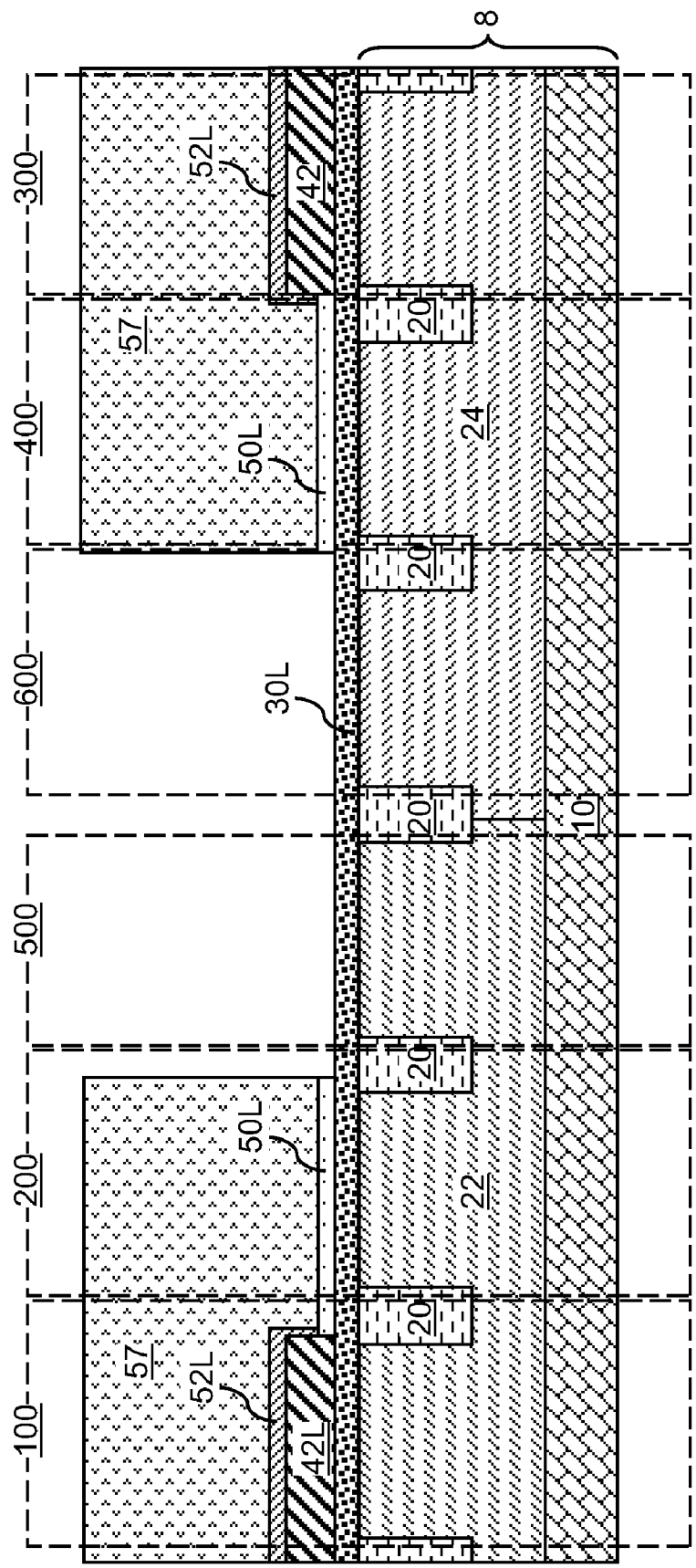
FIG. 5 is a vertical cross-sectional view of the first exemplary semiconductor structure corresponding to a step after patterning of a first dielectric metal oxide layer.

Referring to FIG. 5, a second photoresist 57 is applied over the first dielectric metal oxide layer 50L and the first metal layer 52L and is lithographically patterned to cover the portions of the first dielectric metal oxide layer 50L in the second device region 200 and the fourth device region 400. In one embodiment, the first metal layer 52L is covered with the second photoresist 57 in the first and third device regions (100, 300). In another embodiment, the first metal layer 52L may be exposed, i.e., not covered by the second photoresist 57, in the first and third device regions (100, 300). The top surface of the first dielectric metal oxide layer 50L is exposed in the fifth device region 500 and the sixth device region 600. The exposed portions of the first dielectric metal oxide layer 50L are removed by an etch employing the second photoresist 57 as an etch mask. The etch may be a dry etch or a wet etch. Preferably, the etch is selective to the material of the high-k gate dielectric layer 30L, i.e., does not remove the high-k gate dielectric layer 30L in any substantial manner. Thus, the top surface of the high-k gate dielectric layer 30L is exposed after the etch in the fifth and sixth device regions (500, 600). The second photoresist 57 is subsequently removed.

Figure 6:
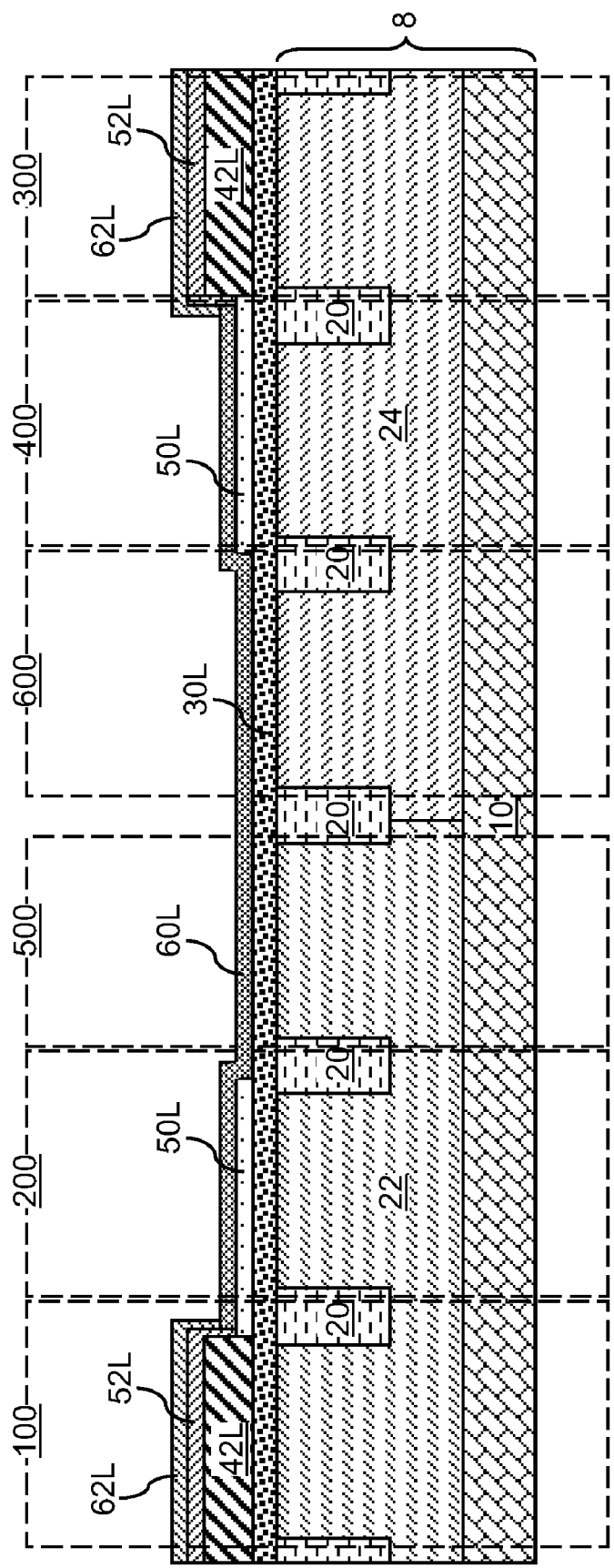
FIG. 6 is a vertical cross-sectional view of the first exemplary semiconductor structure corresponding to a step after deposition of a second metal layer.

Referring to FIG. 6, a second metal layer 62L is deposited on the surfaces of the first metal layer 52L, the first dielectric metal oxide layer 50L, and the exposed surface of the high-k gate dielectric layer 30L. The second metal layer 62L includes an element in group IIA or group IIIB in the Periodic Table of Elements. The material of the second metal layer 62L may be the same as, or different from, the material of the first metal layer 52L. The second metal layer 62L may be formed in the same manner as formation of the first metal layer 52L. The second metal layer 62L may include one of Be, Mg, Ca, Sr, Ba, Ra, Sc, Y, La, Ce, Pr, Nd, Pm, Sm, Eu, Gd, Tb, Dy, Ho, Er, Tm, Yb, and Lu. The thickness of the second metal layer 62L may be from 0.1 nm to 0.8 nm, although lesser and greater thicknesses are also explicitly contemplated.

The portion of the second metal layer 62L deposited directly on the high-k gate dielectric layer 30L or the first dielectric metal oxide layer 50L acquires oxygen from the underlying high-k gate dielectric layer 30L. The oxygen from the underlying high-k gate dielectric layer 30L may be provided into an overlying portion of the second metal layer 62L by direct contact or through the first dielectric metal oxide layer 50L. By combining with oxygen, the portion of the second metal layer 62L directly above the high-k gate dielectric layer 30L or directly above the first dielectric metal oxide layer 50L is converted into a second dielectric metal oxide layer 60L. The thickness of the second metal layer 62L is selected such that the entirety of the second metal layer 62L direct above the high-k gate dielectric layer 30L or directly above the first dielectric metal oxide layer 50L is converted into the second dielectric metal oxide layer 60L.

The second dielectric metal oxide layer 60L contains an oxide of the metal of the second metal layer 62L. The second metal layer 62L is not converted over the top surfaces and sidewall surfaces of the first metal layer 52L because the metal gate layer 42L or the first metal layer 52L do not provide any oxygen. The second metal layer 62L containing a group IIA element or a group IIIB element is formed directly on the top surfaces and sidewalls of the first metal layer 52L in the first device region 100 and the third device region 300. The second dielectric metal oxide layer 60L is formed directly on the first dielectric metal oxide layer 50L in the second and fourth device regions (200, 400). The second dielectric metal oxide layer 60L is also formed directly on the high-k gate dielectric layer 30L in the fifth and sixth device regions (500, 600).

Figure 7:
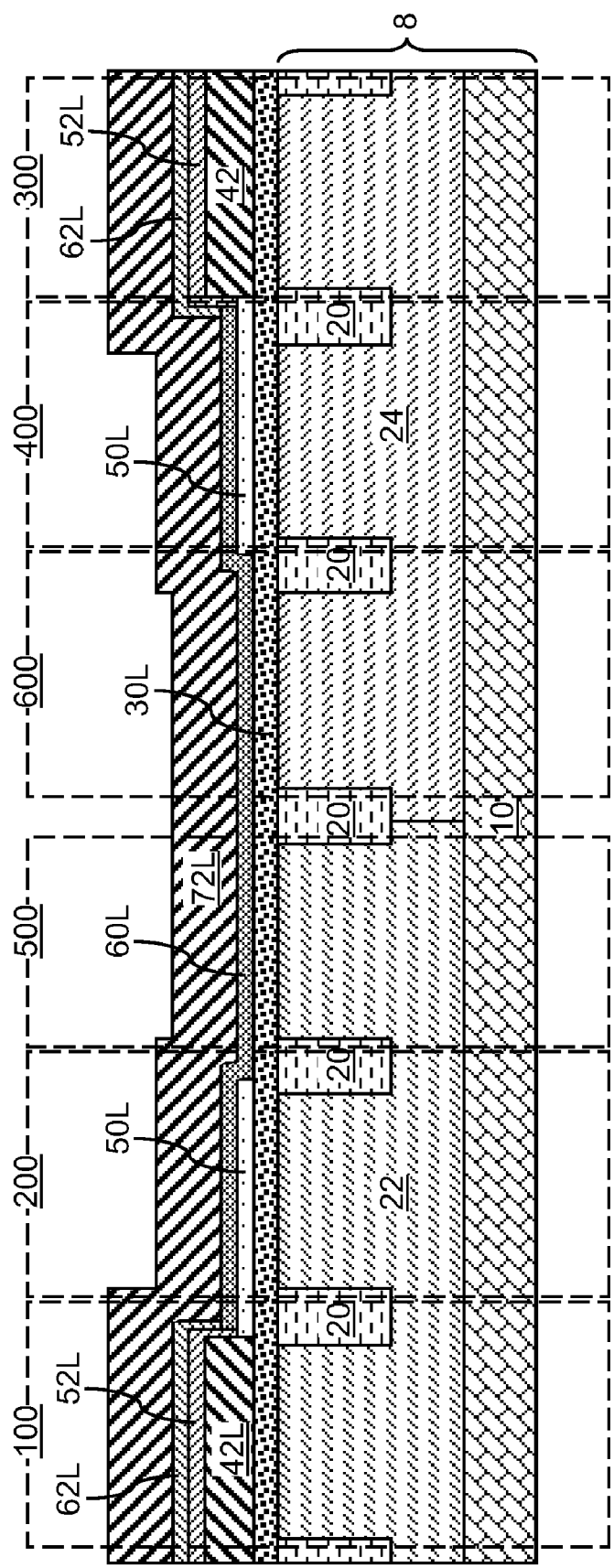
FIG. 7 is a vertical cross-sectional view of the first exemplary semiconductor structure corresponding to a step after formation of a conductive gate material layer.

Referring to FIG. 7, a conductive gate material layer 72L is formed directly on the second dielectric metal oxide layer 60L and the second metal layer 62L. The conductive gate material layer 72L comprises a conductive material, which may be a doped semiconductor material or a metallic material. The thickness of the conductive gate material layer 72L may be from 10 nm to 120 nm, although lesser and greater thicknesses are also explicitly contemplated herein.

In case the conductive gate material layer 72L contains a doped semiconductor material, the doped semiconductor material may be a polycrystalline or amorphous semiconductor material. The doped semiconductor material includes at least one of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The doped semiconductor material may be deposited with in-situ doping as a doped semiconductor material layer, or may be deposited as an undoped semiconductor material layer and subsequently doped by ion implantation.

In case the conductive gate material layer 72L comprises a metallic material, the conductive gate material layer 72L may comprise any of the material that may be employed for the metal gate layer 42L as described above. The conductive gate material layer 72L may comprise the same material as, or a different material from, the material of the metal gate layer 42L.

Figure 8:
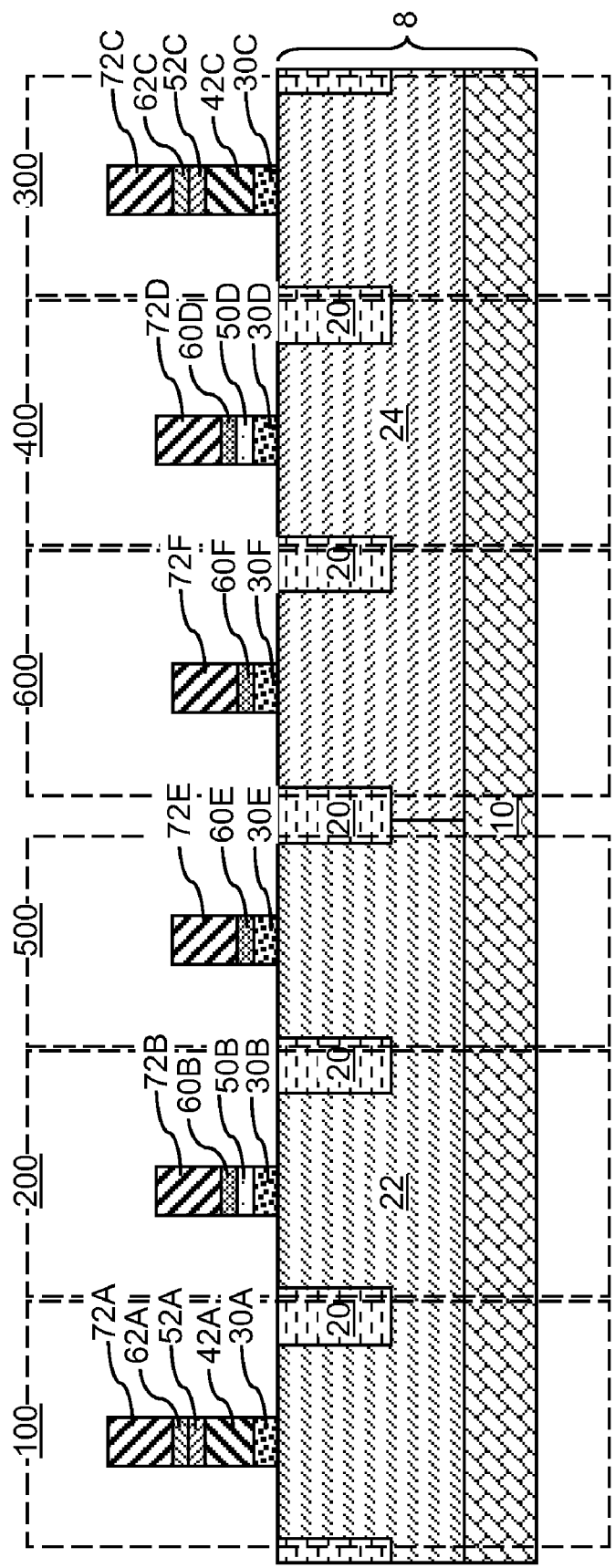
FIG. 8 is a vertical cross-sectional view of the first exemplary semiconductor structure corresponding to a step after patterning of various gate stacks.

Referring to FIG. 8, the stack of material layers (42L, 52L, 50L, 62L, 60L, 72L) above the top surface of the semiconductor substrate 8 is lithographically patterned to form various gate stacks. Specifically, first through sixth gate stacks are formed in the first through sixth device regions (100, 200, 300, 400, 500, 600), respectively. The first gate stack in the first device region 100 includes, from bottom to top, a first high dielectric constant (high-k) gate dielectric 30A, a first metal gate portion 42A, a first-device first metal portion 52A, a first-device second metal portion 62A, and a first conductive gate material portion 72A. The second gate stack in the second device region 200 includes, from bottom to top, a second high-k gate dielectric 30B, a second-device first dielectric metal oxide portion 50B, a second-device second dielectric metal oxide portion 60B, and a second conductive gate material portion 72B. The third gate stack in the third device region 300 includes, from bottom to top, a third high-k gate dielectric 30C, a second metal gate portion 42C, a third-device first metal portion 52C, a third-device second metal portion 62C, and a third conductive gate material portion 72C. The fourth gate stack in the fourth device region 400 includes, from bottom to top, a fourth high-k gate dielectric 30D, a fourth-device first dielectric metal oxide portion 50D, a fourth-device second dielectric metal oxide portion 60D, and a fourth conductive gate material portion 72D. The fifth gate stack in the fifth device region 500 includes, from bottom to top, a fifth high-k gate dielectric 30E, a fifth-device dielectric metal oxide portion 60E, and a fifth conductive gate material portion 72E. The sixth gate stack in the sixth device region 600 includes, from bottom to top, a sixth high-k gate dielectric 30F, a sixth-device dielectric metal oxide portion 60F, and a sixth conductive gate material portion 72F.

The first high-k gate dielectric 30A, the second high-k gate dielectric 30B, the third high-k gate dielectric 30C, the fourth high-k gate dielectric 30D, the fifth high-k gate dielectric 30E, and the sixth high-k gate dielectric 30F are remaining portions of the high-k gate dielectric layer 30L after patterning of the gate stacks. The first metal gate portion 42A and the second metal gate portion 42C are remaining portions of the metal gate layer 42L after patterning of the gate stacks. The first-device first metal portion 52A and the third-device first metal portion 52C are remaining portions of the first metal layer 52L. The first-device second metal portion 62A and the third device second metal portion 62C are remaining portions of the second metal layer 62L. The second-device first dielectric metal oxide portion 50B and the fourth-device first dielectric metal oxide portion 50D are remaining portions of the first dielectric metal oxide layer 50L. The second-device second dielectric metal oxide portion 60B, fourth-device second dielectric metal oxide portion 60D, the fifth-device dielectric metal oxide portion 60E, and the sixth-device dielectric metal oxide portion 60F are remaining portions of the second dielectric metal oxide layer 60L. The first through sixth conductive gate material portion (72A-72F) are remaining portions of the conductive gate material layer 72L. Each portion of the first through sixth gate stacks has the same composition and thickness as the layer from which that portion is derived.

Figure 9:
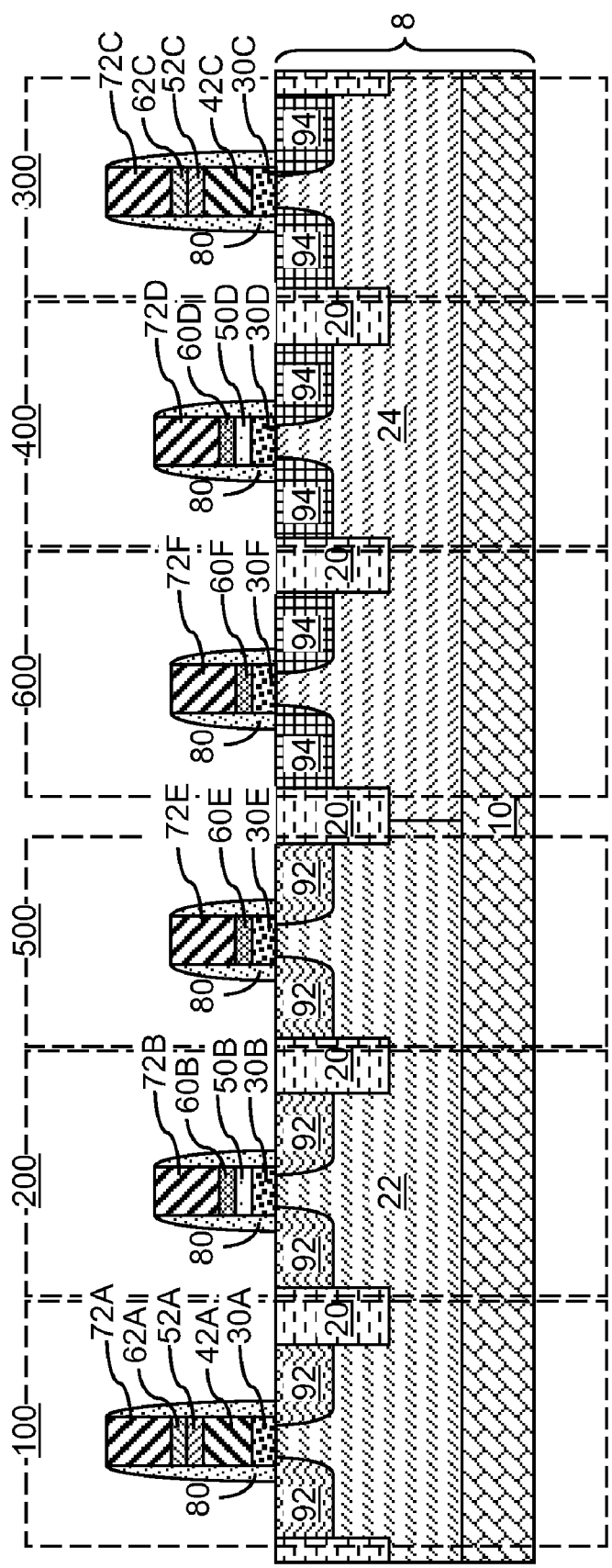
FIG. 9 is a vertical cross-sectional view of the first exemplary semiconductor structure corresponding to a step after formation of various field effect transistors.

Referring to FIG. 9, source and drain extension implantations are performed as needed. Dopants of the second conductivity type may be implanted into upper portions of the first doped semiconductor well 22 having a doping of the first conductivity type, while the second doped semiconductor well 24 is masked with a first patterned masking layer (not shown). First source and drain extension regions (not shown) having a doping of the second conductivity type may be formed in the first doped semiconductor well 22. Dopants of the first conductivity type may be implanted into upper portions of the second doped semiconductor well 24 having a doping of the second conductivity type, while the first doped semiconductor well 22 is masked with a second patterned masking layer (not shown). Second source and drain extension regions (not shown) having a doping of the first conductivity type may be formed in the second doped semiconductor well 24. Halo implantation may be performed as needed.

Dielectric gate spacers 80 are formed on the sidewalls of the first through sixth gate stacks. For example, the dielectric gate spacers 80 may be formed by deposition of a dielectric material layer followed by an anisotropic etch that removes horizontal portions of the dielectric material layer. The remaining vertical portions of the dielectric material layer on the sidewalls of the first through sixth gate stacks constitute the dielectric gate spacers.

First source and drain regions 92 having a doping of the second conductivity type are formed in upper portions of the first doped semiconductor well 22 by implanting dopants of the second conductivity type. The first source and drain regions 92 may the same concentration of the second conductivity type dopants across the first, second, and fifth device regions (100, 200, 500). The dopant concentration of the second conductivity type dopants in the first source and drain regions 92 may be from $3.0 \times 10^{19}$ atoms/cm$^3$ to $3.0 \times 10^{21}$ atoms/cm$^3$, and is typically from $1.0 \times 10^{20}$ atoms/cm$^3$ to $1.0 \times 10^{21}$ atoms/cm$^3$. During the formation of the first source and drain regions 92, the third, fourth, and sixth device regions (300, 400, 600) are covered by a patterned masking layer, which functions as a blocking mask for the dopants of the second conductivity type during the ion implantation.

Second source and drain regions 94 having a doping of the first conductivity type are formed in upper portions of the second doped semiconductor well 24 by implanting dopants of the first conductivity type. The second source and drain regions 94 may the same concentration of the first conductivity type dopants across the third, fourth, and sixth device regions (300, 400, 600). The dopant concentration of the first conductivity type dopants in the second source and drain regions 94 may be from $3.0 \times 10^{19}$ atoms/cm$^3$ to $3.0 \times 10^{21}$ atoms/cm$^3$, and is typically from $1.0 \times 10^{20}$ atoms/cm$^3$ to $1.0 \times 10^{21}$ atoms/cm$^3$. During the formation of the second source and drain regions 94, the first, second, and fifth device regions (100, 200, 500) are covered by another patterned masking layer, which functions as a blocking mask for the dopants of the first conductivity type during the ion implantation.

The first semiconductor structure includes field effect transistors of the second conductivity type and field effect transistors of the first conductivity type. Particularly, field effect transistors in the first, second, and fifth device regions (100, 200, 500) are field effect transistors of the second conductivity type. Field effect transistors in the third, fourth, and sixth device regions (300, 400, 600) are field effect transistors of the first conductivity type. If the first doped semiconductor well 22 is an n-doped semiconductor well and the second doped semiconductor well 24 is a p-doped semiconductor well, the field effect transistors in the first, second, and fifth device regions (100, 200, 500) are p-type field effect transistors and the field effect transistors in the third, fourth, and sixth device regions (300, 400, 600) are n-type field effect transistors. Conversely, if the first doped semiconductor well 22 is a p-doped semiconductor well and the second doped semiconductor well 24 is an n-doped semiconductor well, the field effect transistors in the first, second, and fifth device regions (100, 200, 500) are n-type field effect transistors and the field effect transistors in the third, fourth, and sixth device regions (300, 400, 600) are p-type field effect transistors.

Because the field effect transistors in the first, second, and fifth device regions (100, 200, 500) are formed in the same first doped semiconductor well 22 having the same dopant concentration throughout, these transistors have substantially the same source-to-body junction current per unit width thereamongst as well as substantially the same drain-to-body junction current per unit width thereamongst. Likewise, because the field effect transistors in the third, fourth, and sixth device regions (300, 400, 600) are formed in the same second doped semiconductor well 24 having the same dopant concentration throughout, these transistors have substantially the same source-to-body junction current per unit width thereamongst as well as substantially the same drain-to-body junction current per unit width thereamongst. The width of a transistor herein refers to the width of the channel of a field effect transistor measured in the direction perpendicular to the direction of the current flow and within the plane of the interface between the channel and the gate dielectric. The source-to-body junction current is a leakage current between a source and a body of a transistor. The drain-to-body junction current is a leakage current between a drain and a body of a transistor. Because the drain-to-source current is not a leakage current and does not involve the body, the drain-to-source current is excluded from the source-to-body junction current and the drain-to-body junction current. The field effect transistors in the first through sixth device regions (100, 200, 300, 400, 500, 600) may be bulk field effect transistors or may be SOI field effect transistors.

Each of the field effect transistor among the field effect transistors in the first, second, and fifth device regions (100, 200, 500) have a different threshold voltage than the other two field effect transistors. Such differentiation of the threshold voltages is not effected by modification of the dopant concentration in the first doped semiconductor well 22. The first doped semiconductor well 22 has the same dopant concentration in the first, second, and fifth device regions (100, 200, 500). Instead, the differentiation of the threshold voltages among the three field effect transistors in the first, second, and fifth device regions (100, 200, 500) is effected by the differences in the structure of their gate stacks.

Particularly, the threshold voltage of the first field effect transistor in the first device region 100 is determined by the material and thickness of the first high-k gate dielectric 30A and the work function of the first metal gate portion 42A. The threshold voltage of the second field effect transistor in the second device region 200 is determined by the materials and thicknesses of the second high-k gate dielectric 30B, the second-device first dielectric metal oxide portion 50B, and the second-device second dielectric metal oxide portion 60B and the work function of the second conductive gate material portion 72B. The threshold voltage of the fifth field effect transistor in the fifth device region 500 is determined by the materials and thicknesses of the fifth high-k gate dielectric 30E and the fifth-device dielectric metal oxide portion 60E and the work function of the fifth conductive gate material portion 72E.

Each of the field effect transistor among the field effect transistors in the third, fourth, and sixth device regions (300, 400, 600) have a different threshold voltage than the other two field effect transistors. Such differentiation of the threshold voltages is not effected by modification of the dopant concentration in the first doped semiconductor well 22. The second doped semiconductor well 24 has the same dopant concentration in the third, fourth, and sixth device regions (300, 400, 600). Instead, the differentiation of the threshold voltages among the three field effect transistors in the third, fourth, and sixth device regions (300, 400, 600) is effected by the differences in the structure of their gate stacks.

Particularly, the threshold voltage of the third field effect transistor in the third device region 300 is determined by the material and thickness of the third high-k gate dielectric 30C and the work function of the second metal gate portion 42C. The threshold voltage of the fourth field effect transistor in the fourth device region 400 is determined by the materials and thicknesses of the fourth high-k gate dielectric 30D, the fourth-device first dielectric metal oxide portion 50D, and the fourth-device second dielectric metal oxide portion 60D and the work function of the fourth conductive gate material portion 72B. The threshold voltage of the sixth field effect transistor in the sixth device region 600 is determined by the materials and thicknesses of the sixth high-k gate dielectric 30F and the sixth-device dielectric metal oxide portion 60F and the work function of the sixth conductive gate material portion 72F.

Figure 10:
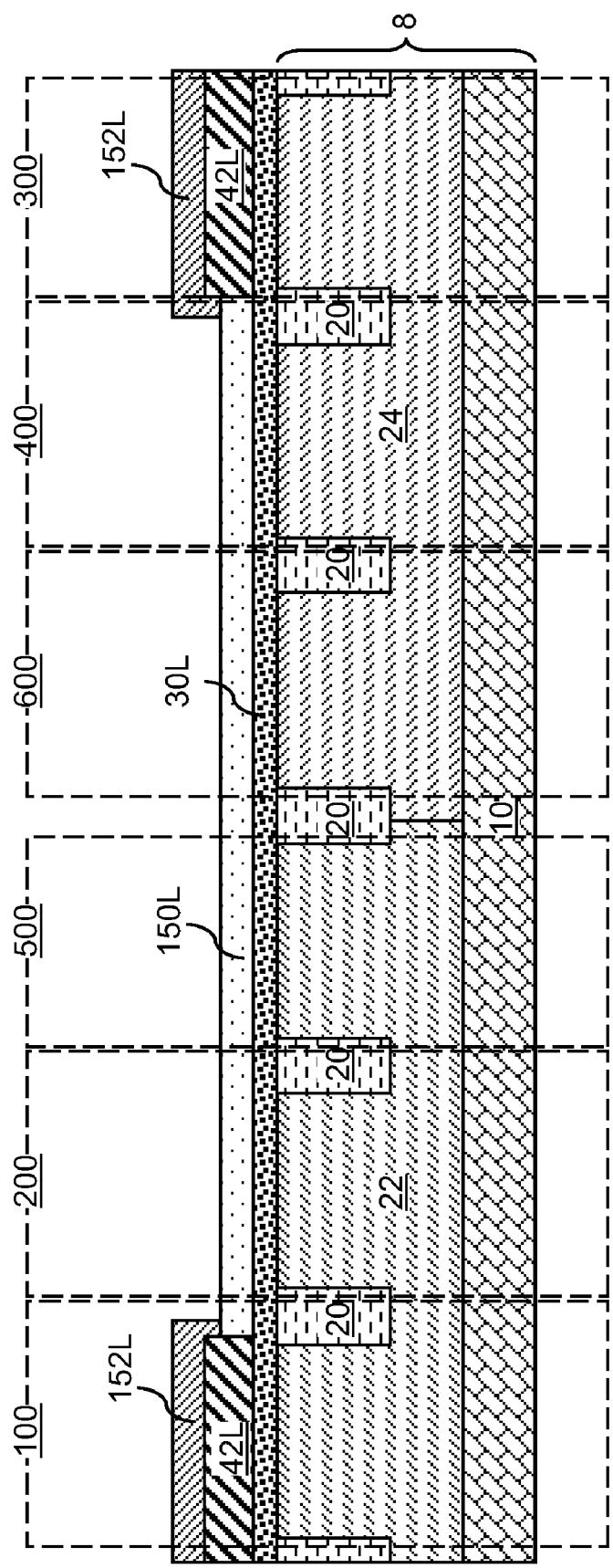
FIG. 10 is a vertical cross-sectional view of a second exemplary semiconductor structure corresponding to a step after formation of a metal layer.

Referring to FIG. 10, a second exemplary semiconductor structure according to a second embodiment of the present invention is derived from the first exemplary semiconductor structure of FIG. 3 by removing the first photoresist 47 and depositing a metal layer 152L on the exposed surfaces of the metal gate layer 42L and the exposed surface of the high-k gate dielectric layer 30L. The metal layer 152L is a group IIA/IIIB element layer, i.e., includes an element in group IIA or group IIIB in the Periodic Table of Elements. The metal layer 152L may be formed directly on the high-k gate dielectric layer 30L and the metal gate layer 42L employing the same method as may be employed for formation of the first metal layer 52L in the first embodiment. The metal layer 152L may include the same metal as in the first embodiment. The thickness of the metal layer 152L may be from 0.1 nm to 1.6 nm, and typically from 0.1 nm to 0.8 nm, although lesser and greater thicknesses are also explicitly contemplated.

The portion of the metal layer 152L deposited directly on the high-k gate dielectric layer 30L acquires oxygen from the underlying high-k gate dielectric layer 30L. By combining with oxygen, the portion of the metal layer 152L directly above the high-k gate dielectric layer 30L is converted into a dielectric metal oxide layer 150L. The dielectric metal oxide layer 150L contains an oxide of the metal of the metal layer 152L. The metal layer 152L is not converted over the top surfaces and sidewall surfaces of the metal gate layer 42L because the metal gate layer 42L does not provide any oxygen. The metal layer 152L containing a group IIA element or a group IIIB element is formed directly on the top surfaces and sidewalls of the metal gate layer 42L in the first device region 100 and the third device region 300. The dielectric metal oxide layer 150L is formed directly on the high-k gate dielectric layer 30L in the second, fourth, fifth, and sixth device regions (200, 400, 500, 600).

Figure 11:
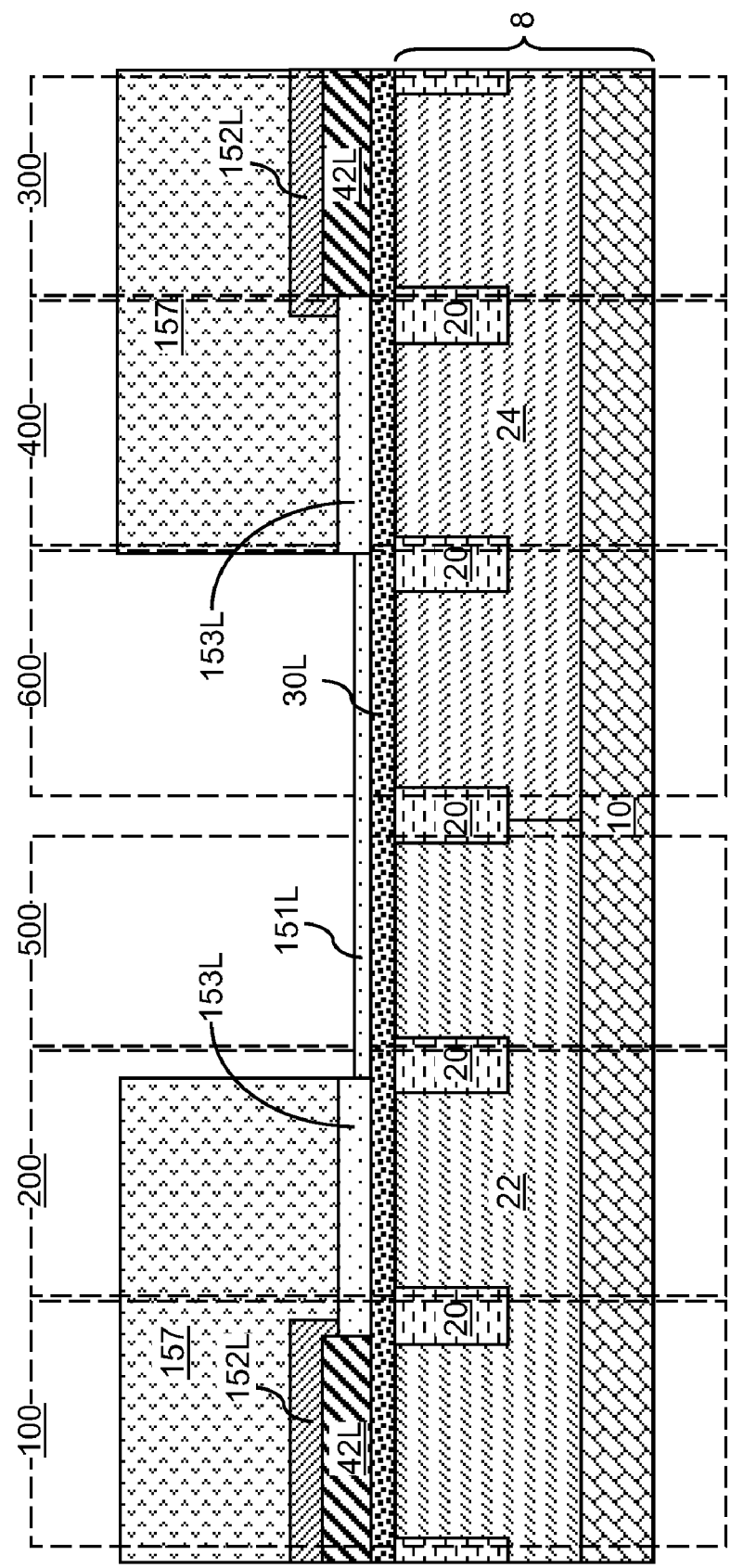
FIG. 11 is a vertical cross-sectional view of the second exemplary semiconductor structure corresponding to a step after thinning of a portion of the metal layer.

Referring to FIG. 11, a photoresist 157 is applied over the dielectric metal oxide layer 150L and the metal layer 152L and is lithographically patterned to cover the portions of the dielectric metal oxide layer 150L in the second device region 200 and the fourth device region 400. In one embodiment, the metal layer 152L is covered with the photoresist 57 in the first and third device regions (100, 300). In another embodiment, the metal layer 152L may be exposed, i.e., not covered by the photoresist 157, in the first and third device regions (100, 300). The top surface of the dielectric metal oxide layer 150L is exposed in the fifth device region 500 and the sixth device region 600. The exposed portions of the dielectric metal oxide layer 150L are recessed by an etch employing the photoresist 57 as an etch mask. The etch may be a dry etch or a wet etch. The etch reduces the exposed portion of the dielectric metal oxide layer 150L. The portions of the dielectric metal oxide layer 150L under the photoresist 157 maintains the original thickness, and is herein referred to as a first-thickness dielectric metal oxide layer 153L. The portions of the dielectric metal oxide layer 150L that has a reduced thickness due to the etch is herein referred to as a second-thickness dielectric metal oxide layer 151L. The thickness of the first-thickness dielectric metal oxide layer 153L is a first thickness, and the thickness of the second-thickness dielectric metal oxide layer 151L is a second thickness. The second thickness is less than the first thickness. The second-thickness dielectric metal oxide layer 151L and the first-thickness dielectric metal oxide layer 153L are of integral and unitary construction, i.e., in one piece. The photoresist 157 is subsequently removed.

Figure 12:
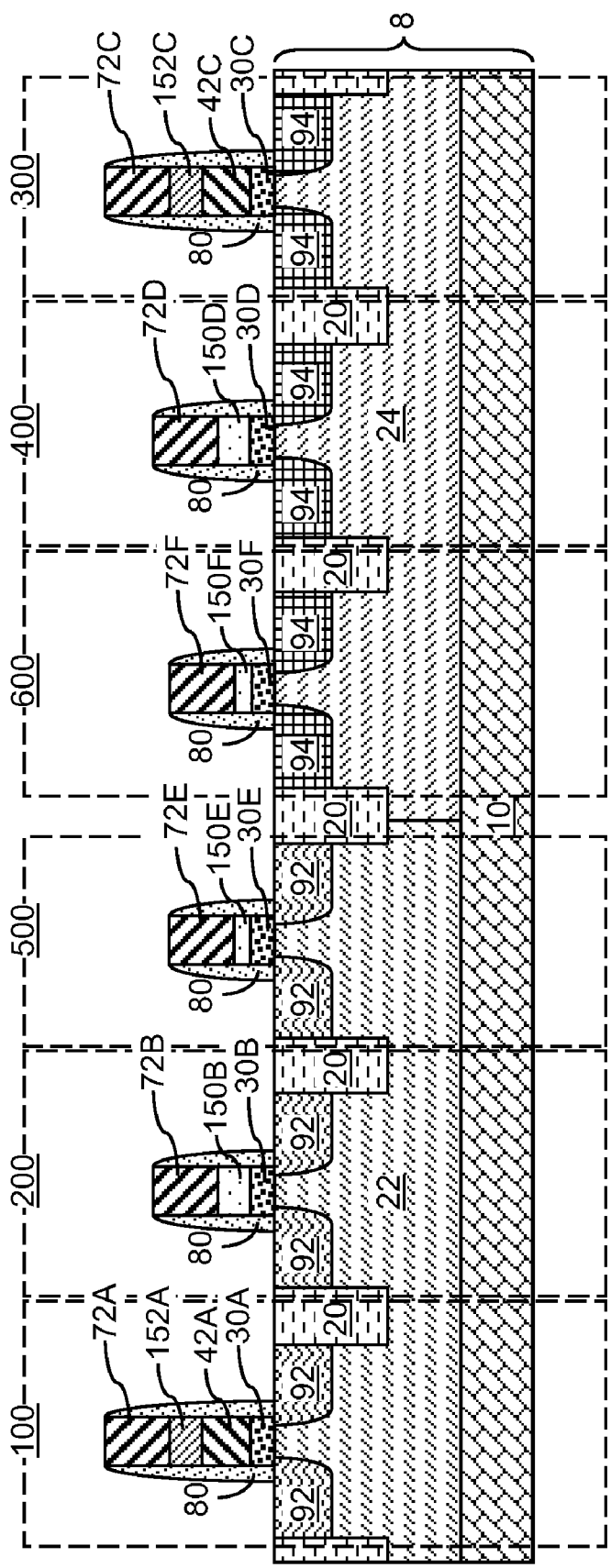
FIG. 12 is a vertical cross-sectional view of the second exemplary semiconductor structure corresponding to a step after formation of various field effect transistors.

Referring to FIG. 12, the processing steps of the first embodiment corresponding to FIGS. 7-9 are performed on the second exemplary semiconductor structure to form field effect transistors of the second conductivity type and field effect transistors of the first conductivity type. Particularly, field effect transistors in the first, second, and fifth device regions (100, 200, 500) are field effect transistors of the second conductivity type. Field effect transistors in the third, fourth, and sixth device regions (300, 400, 600) are field effect transistors of the first conductivity type.

The first gate stack in the first device region 100 includes, from bottom to top, a first high dielectric constant (high-k) gate dielectric 30A, a first metal gate portion 42A, a first metal portion 152A, and a first conductive gate material portion 72A. The second gate stack in the second device region 200 includes, from bottom to top, a second high-k gate dielectric 30B, a first first-thickness dielectric metal oxide portion 150B, and a second conductive gate material portion 72B. The third gate stack in the third device region 300 includes, from bottom to top, a third high-k gate dielectric 30C, a second metal gate portion 42C, a second metal portion 152C, and a third conductive gate material portion 72C. The fourth gate stack in the fourth device region 400 includes, from bottom to top, a fourth high-k gate dielectric 30D, a second first-thickness dielectric metal oxide portion 150D, and a fourth conductive gate material portion 72D. The fifth gate stack in the fifth device region 500 includes, from bottom to top, a fifth high-k gate dielectric 30E, a first second-thickness dielectric metal oxide portion 150E, and a fifth conductive gate material portion 72E. The sixth gate stack in the sixth device region 600 includes, from bottom to top, a sixth high-k gate dielectric 30F, a second second-thickness dielectric metal oxide portion 150F, and a sixth conductive gate material portion 72F.

The first high-k gate dielectric 30A, the second high-k gate dielectric 30B, the third high-k gate dielectric 30C, the fourth high-k gate dielectric 30D, the fifth high-k gate dielectric 30E, and the sixth high-k gate dielectric 30F are remaining portions of the high-k gate dielectric layer 30L after patterning of the gate stacks. The first metal gate portion 42A and the second metal gate portion 42C are remaining portions of the metal gate layer 42L after patterning of the gate stacks. The first metal portion 152A and the second metal portion 152C are remaining portions of the metal layer 152L after patterning of the gate stacks. The first first-thickness dielectric metal oxide portion 150B and the second first-thickness dielectric metal oxide portion 150D are remaining portions of the first-thickness dielectric metal oxide layer 153L. The first second-thickness dielectric metal oxide portion 150E and the second second-thickness dielectric metal oxide portion 150E are remaining portions of the second-thickness dielectric metal oxide layer 151L. The first through sixth conductive gate material portion (72A-72F) are remaining portions of the conductive gate material layer 72L. Each portion of the first through sixth gate stacks has the same composition and thickness as the layer from which that portion is derived.

If the first doped semiconductor well 22 is an n-doped semiconductor well and the second doped semiconductor well 24 is a p-doped semiconductor well, the field effect transistors in the first, second, and fifth device regions (100, 200, 500) are p-type field effect transistors and the field effect transistors in the third, fourth, and sixth device regions (300,

400, 600) are n-type field effect transistors. Conversely, if the first doped semiconductor well 22 is a p-doped semiconductor well and the second doped semiconductor well 24 is an n-doped semiconductor well, the field effect transistors in the first, second, and fifth device regions (100, 200, 500) are n-type field effect transistors and the field effect transistors in the third, fourth, and sixth device regions (300, 400, 600) are p-type field effect transistors.

Each of the field effect transistor among the field effect transistors in the first, second, and fifth device regions (100, 200, 500) have a different threshold voltage than the other two field effect transistors. The differentiation of the threshold voltages among the three field effect transistors in the first, second, and fifth device regions (100, 200, 500) is effected by the differences in the structure of their gate stacks. Particularly, the threshold voltage of the first field effect transistor in the first device region 100 is determined by the material and thickness of the first high-k gate dielectric 30A and the work function of the first metal gate portion 42A. The threshold voltage of the second field effect transistor in the second device region 200 is determined by the materials and thicknesses of the second high-k gate dielectric 30B and the first first-thickness dielectric metal oxide portion 150B and the work function of the second conductive gate material portion 72B. The threshold voltage of the fifth field effect transistor in the fifth device region 500 is determined by the materials and thicknesses of the fifth high-k gate dielectric 30E and the first second-thickness dielectric metal oxide portion 150E and the work function of the fifth conductive gate material portion 72E.

Each of the field effect transistor among the field effect transistors in the third, fourth, and sixth device regions (300, 400, 600) have a different threshold voltage than the other two field effect transistors. The differentiation of the threshold voltages among the three field effect transistors in the third, fourth, and sixth device regions (300, 400, 600) is effected by the differences in the structure of their gate stacks.

Particularly, the threshold voltage of the third field effect transistor in the third device region 300 is determined by the material and thickness of the third high-k gate dielectric 30C and the work function of the second metal gate portion 42C. The threshold voltage of the fourth field effect transistor in the fourth device region 400 is determined by the materials and thicknesses of the fourth high-k gate dielectric 30D and the second first-thickness dielectric metal oxide portion 150D and the work function of the fourth conductive gate material portion 72B. The threshold voltage of the sixth field effect transistor in the sixth device region 600 is determined by the materials and thicknesses of the sixth high-k gate dielectric 30F and the second second-thickness dielectric metal oxide portion 150F and the work function of the sixth conductive gate material portion 72F.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a first field effect transistor including a first gate stack, wherein said first gate stack includes, from bottom to top, a first high dielectric constant (high-k) gate dielectric having a dielectric constant greater than 4.0, a metal gate portion, at least one metal portion, and a first conductive gate material portion; and
    a second field effect transistor including a second gate stack, wherein said second gate stack includes, from bottom to top, a second high-k gate dielectric having a dielectric constant greater than 4.0, at least one dielectric metal oxide portion, and a second conductive gate material portion, wherein said first field effect transistor and said second field effect transistor have different threshold voltages.

2. The semiconductor structure of claim 1, wherein said first high-k gate dielectric and said second high-k gate dielectric comprise a same material and have a same thickness, and wherein each of said at least one dielectric metal oxide portion comprises an oxide of a material of one of said at least one metal portion.

3. The semiconductor structure of claim 2, wherein said first conductive gate material portion and said second conductive gate material portion have a same material and have a same thickness, and wherein each of said at least one dielectric metal oxide portion has a thickness from 0.1 nm to 1.0 nm and comprises a group IIA element or a group IIIB element.

4. The semiconductor structure of claim 1, further comprising another field effect transistor including another gate stack, wherein said another gate stack includes, from bottom to top, another high-k gate dielectric having a dielectric constant greater than 4.0, another dielectric metal oxide portion, and another conductive gate material portion, wherein said another field effect transistor has a different threshold voltage than threshold voltages of said first field effect transistor and said second field effect transistor.

5. The semiconductor structure of claim 4, wherein said at least one metal portion includes a first metal portion and a second metal portion, wherein said at least one dielectric metal oxide portion includes a first dielectric metal oxide portion and a second dielectric metal oxide portion, wherein said first dielectric metal oxide portion comprises an oxide of a material of said first metal portion, and wherein said second dielectric metal oxide portion and said another dielectric metal oxide portion comprise an oxide of a material of said second metal portion.

6. The semiconductor structure of claim 1, further comprising a doped semiconductor well located in a semiconductor substrate, wherein said first high-k gate dielectric and said second high-k gate dielectric are located directly on said doped semiconductor well, and wherein a first portion of said doped semiconductor well abutting said first high-k gate dielectric and a second portion of said doped semiconductor well abutting said second high-k gate dielectric have a same dopant concentration and doping type.

7. The semiconductor structure of claim 1, further comprising:
    a third field effect transistor including a third gate stack, wherein said third gate stack includes, from bottom to top, a third high-k gate dielectric having a dielectric constant greater than 4.0, another metal gate portion, at least another metal portion, and a third conductive gate material portion; and
    a fourth field effect transistor including a fourth gate stack, wherein said fourth gate stack includes, from bottom to top, a fourth high-k gate dielectric having a dielectric constant greater than 4.0, at least another dielectric metal oxide portion, and a fourth conductive gate material portion, wherein said third field effect transistor and said fourth field effect transistor have different threshold voltages, and wherein said first and second field effect transistors are p-type field effect transistors and said third and fourth field effect transistors are n-type field effect transistors.

8. The semiconductor structure of claim 7, further comprising:
a n-doped semiconductor well located in a semiconductor substrate, wherein said first high-k gate dielectric and said second high-k gate dielectric are located directly on said n-doped semiconductor well, and wherein a first portion of said n-doped semiconductor well abutting said first high-k gate dielectric and a second portion of said n-doped semiconductor well abutting said second high-k gate dielectric have a same dopant concentration; and
a p-doped semiconductor well located in said semiconductor substrate, wherein said third high-k gate dielectric and said fourth high-k gate dielectric are located directly on said p-doped semiconductor well, and wherein a first portion of said p-doped semiconductor well abutting said third high-k gate dielectric and a second portion of said p-doped semiconductor well abutting said fourth high-k gate dielectric have a same dopant concentration.

9. The semiconductor structure of claim 1, wherein a source-to-body junction current per unit length is substantially the same between said first and second field effect transistors are semiconductor-on-insulator (SOI) field effect transistors located on a buried insulator layer, and wherein a drain-to-body junction current is substantially the same between said first and second field effect transistors are semiconductor-on-insulator (SOI) field effect transistors located on a buried insulator layer.

10. A semiconductor structure comprising:
a first field effect transistor including a first gate stack, wherein said first gate stack includes, from bottom to top, a first high dielectric constant (high-k) gate dielectric, at least one first dielectric metal oxide portion, and a first conductive gate material portion; and
a second field effect transistor including a second gate stack, wherein said second gate stack includes, from bottom to top, a second high-k gate dielectric, at least one second dielectric metal oxide portion, and a second conductive gate material portion, wherein said first field effect transistor and said second field effect transistor have different threshold voltages.

11. The semiconductor structure of claim 10, wherein said first high-k gate dielectric and said second high-k gate dielectric comprise a same material and have a same thickness, and wherein said at least one first dielectric metal oxide portion has a different thickness than said at least one second dielectric metal oxide portion, wherein said first conductive gate material portion and said second conductive gate material portion have a same material and have a same thickness.

12. The semiconductor structure of claim 11, wherein each of said at least one first dielectric metal oxide portion has a thickness from 0.1 nm to 1.0 nm and comprises a group IIA element or a group IIIB element, and wherein each of said at least one second dielectric metal oxide portion has a thickness from 0.1 nm to 1.0 nm and comprises a group IIA element or a group IIIB element.

13. The semiconductor structure of claim 11, wherein said at least one first dielectric metal oxide portion comprises a first upper dielectric metal oxide portion and a first lower dielectric metal oxide portion, wherein an entirety of said at least one second dielectric metal oxide portion has the same composition and the same thickness as said first upper dielectric metal oxide portion.

14. The semiconductor structure of claim 11, wherein an entirety of said at least one first dielectric metal oxide portion has the same composition as an entirety of said at least one second dielectric metal oxide portion.

15. The semiconductor structure of claim 10, further comprising another field effect transistor including another gate stack, wherein said another gate stack includes, from bottom to top, another high-k gate dielectric having a dielectric constant greater than 4.0, a metal gate portion, at least one metal portion, and another conductive gate material portion, wherein said another field effect transistor has a different threshold voltage than threshold voltages of said first field effect transistor and said second field effect transistor.

16. The semiconductor structure of claim 15, wherein each of said at least one first dielectric metal oxide portion and said at least one second dielectric metal oxide portion comprises an oxide of a material of one of said at least one metal portion.

17. The semiconductor structure of claim 10, further comprising a doped semiconductor well located in a semiconductor substrate, wherein said first high-k gate dielectric and said second high-k gate dielectric are located directly on said doped semiconductor well, and wherein a first portion of said doped semiconductor well abutting said first high-k gate dielectric and a second portion of said doped semiconductor well abutting said second high-k gate dielectric have a same dopant concentration and doping type.

18. The semiconductor structure of claim 10, further comprising:
a third field effect transistor including a third gate stack, wherein said third gate stack includes, from bottom to top, a third high-k gate dielectric, at least one third dielectric metal oxide portion, and a third conductive gate material portion; and
a fourth field effect transistor including a fourth gate stack, wherein said fourth gate stack includes, from bottom to top, a fourth high-k gate dielectric, at least one fourth dielectric metal oxide portion, and a fourth conductive gate material portion, wherein said third field effect transistor and said fourth field effect transistor have different threshold voltages, and wherein said first and second field effect transistors are p-type field effect transistors and said third and fourth field effect transistors are n-type field effect transistors.

19. The semiconductor structure of claim 18, further comprising:
a n-doped semiconductor well located in a semiconductor substrate, wherein said first high-k gate dielectric and said second high-k gate dielectric are located directly on said n-doped semiconductor well, and wherein a first portion of said n-doped semiconductor well abutting said first high-k gate dielectric and a second portion of said n-doped semiconductor well abutting said second high-k gate dielectric have a same dopant concentration; and
a p-doped semiconductor well located in said semiconductor substrate, wherein said third high-k gate dielectric and said fourth high-k gate dielectric are located directly on said p-doped semiconductor well, and wherein a first portion of said p-doped semiconductor well abutting said third high-k gate dielectric and a second portion of said p-doped semiconductor well abutting said fourth high-k gate dielectric have a same dopant concentration.

* * * * *